(12) United States Patent
Bartley et al.

(10) Patent No.: US 7,202,685 B1
(45) Date of Patent: Apr. 10, 2007

(54) EMBEDDED PROBE-ENABLING SOCKET WITH INTEGRAL PROBE STRUCTURES

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew Benson Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/290,876

(22) Filed: Nov. 30, 2005

(51) Int. Cl.
*G01R 31/26* (2006.01)
*G01R 31/02* (2006.01)

(52) U.S. Cl. .................. 324/760; 324/765; 324/754; 165/80.3

(58) Field of Classification Search ............... 324/760, 324/765; 165/80.3
See application file for complete search history.

(56) References Cited

U.S. PATENT DOCUMENTS

| | | | | |
|---|---|---|---|---|
| 6,396,698 B1 * | 5/2002 | Holcombe | ............ | 361/704 |
| 6,636,061 B1 * | 10/2003 | Crook et al. | ............ | 324/755 |
| 6,667,631 B2 * | 12/2003 | Ivanov | ............ | 324/762 |
| 6,812,485 B2 * | 11/2004 | Shah et al. | ............ | 257/48 |
| 2004/0257103 A1 * | 12/2004 | Park et al. | ............ | 324/765 |

* cited by examiner

*Primary Examiner*—Vinh Nguyen
*Assistant Examiner*—Emily Y Chan
(74) *Attorney, Agent, or Firm*—Joan Pennington

(57) ABSTRACT

A method of testing and an embedded probe-enabling socket are provided for implementing debug and testing functions. The socket includes an integral probe structure enabling Top Side of the Module (TSM) signal probing. The socket includes a substrate with a topside including a plurality of probe pads. A TSM socket frame includes a plurality of probe pins electrically connecting to respective probe pads on the substrate topside. The probe pins are electrically connected with a respective signal to be monitored.

9 Claims, 4 Drawing Sheets

EMBEDDED PROBE-ENABLING SOCKET WITH INTEGRAL PROBE STRUCTURES

FIELD OF THE INVENTION

The present invention relates generally to the data processing field, and more particularly, relates to a method of testing and an embedded probe-enabling socket including an integral probe structure.

DESCRIPTION OF THE RELATED ART

As used in the following description and claims the terms ball grid array (BGA) device and BGA connections are not limited to BGA solder connections and should be understood to include multiple various other chip carrier technologies including, for example, Land Grid Array (LGA), pin grid array, and copper-copper thermal compression connections and devices.

Sockets are often utilized early in development programs to facilitate easy removal and replacement of prototype parts. These traditional socket designs used for system and component bring-up, debug and characterization screening only allow for electrical connection on the Bottom Side of the Module (BSM).

The electrical connection on the BSM is accomplished via compliant connections to the land grid array (LGA), ball grid array (BGA), or column grid array (CGA) device lead constructs. The bottom side only probe connection restriction requires that all test and debug signals must be routed to the BSM. As a result, test and debug signal requirements drive additional module signal I/O and consequently module size and cost along with additional card complexities to route and access these test and debug signals.

Generally the added complexities and costs for these necessary debug and test capabilities have residual effects on the product long after their use in the development and prototype stages have waned. Although some of the capability is still useful in manufacturing test and failure analysis, generally the full capability of these types of functions is used much less, if at all toward the mature shipping stages of the product cycle.

To remove these debug and test capabilities after debug and testing is complete generally requires redesign of the carrier, the card, any shippable socketting or thermal interface structures, test socketting in the factory and the like. The risks associated with such a redesign can be very large.

A need exists for an improved mechanism for implementing debug and testing functions.

SUMMARY OF THE INVENTION

A principal aspect of the present invention is to provide an embedded probe-enabling socket. Other important aspects of the present invention are to provide such an embedded probe-enabling socket substantially without negative effect and that overcomes many of the disadvantages of prior art arrangements.

In brief, a method of testing and an embedded probe-enabling socket are provided for implementing debug and testing functions. The socket includes an integral probe structure enabling Top Side of the Module (TSM) signal probing. The socket includes a substrate having a topside that includes a plurality of probe pads. A TSM socket frame includes a plurality of probe pins electrically connecting to respective probe pads on the substrate topside. The probe pins are electrically connected with a respective signal to be monitored.

In accordance with features of the invention, the test and debug signals are routed only to the TSM of the module substrate and thereby reserving the Bottom Side of the Module (BSM) of the module for functional signals. The module substrate includes a ball grid array (BGA) on a bottom-side electrically connected to the respective functional signals and a BSM socket frame includes plurality of probe pins electrically connecting to respective functional signal pads on a printed circuit board (PCB).

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, Top Side of the Module (TSM), or top side of chip carrier package, signal probing capability is integrated into a module socket design. By integrating TSM signal probing capability into the socket, the test and debug signals advantageously are routed only to the TSM of the module substrate and thereby reserve the BSM of the module for functional signals. This allows optimizing the size and cost of the module based solely on the functional signal I/O count. TSM signal probing enables a much lower residual cost and reduced complexity for the shippable product as well as improved electrical access and capability during the prototype and debug stages of the development cycle.

Figure 1:
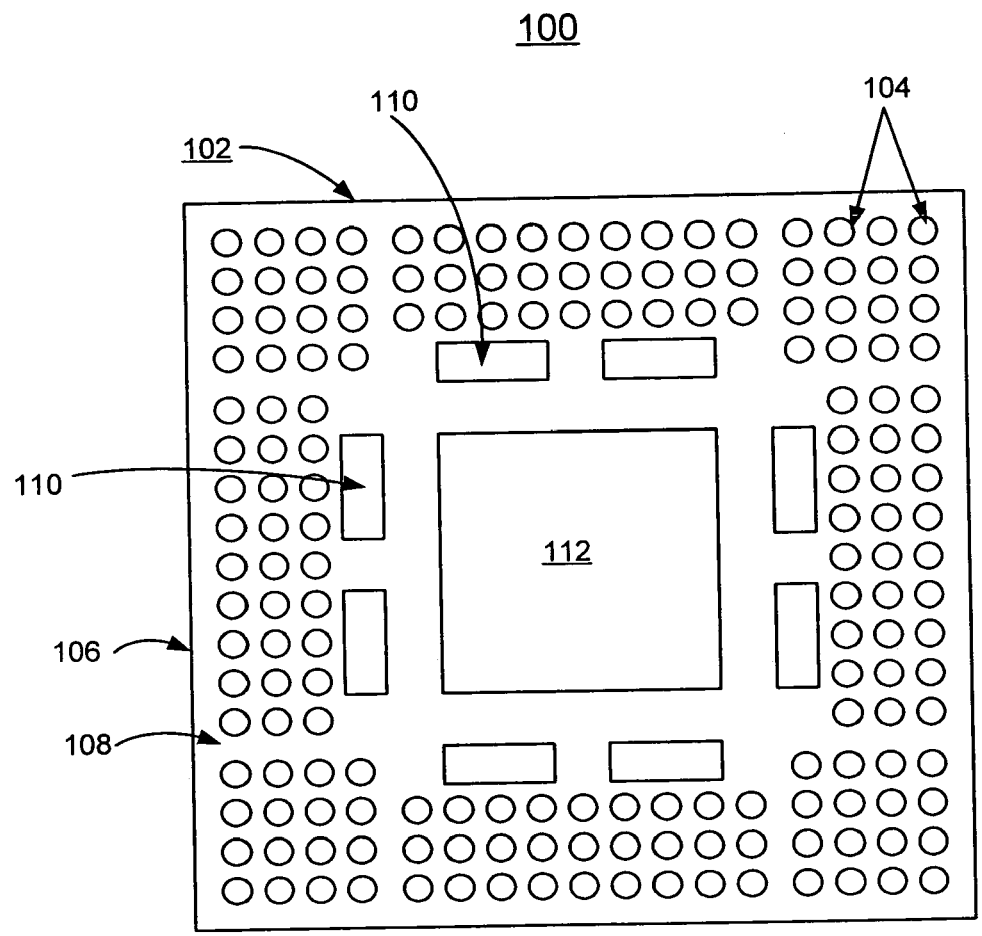
FIG. 1 is a top plan view illustrating a topside substrate with multiple probe pads of an exemplary an embedded probe-enabling socket including an integral probe structure of FIG. 2 in accordance with the preferred embodiment.
Figure 2:
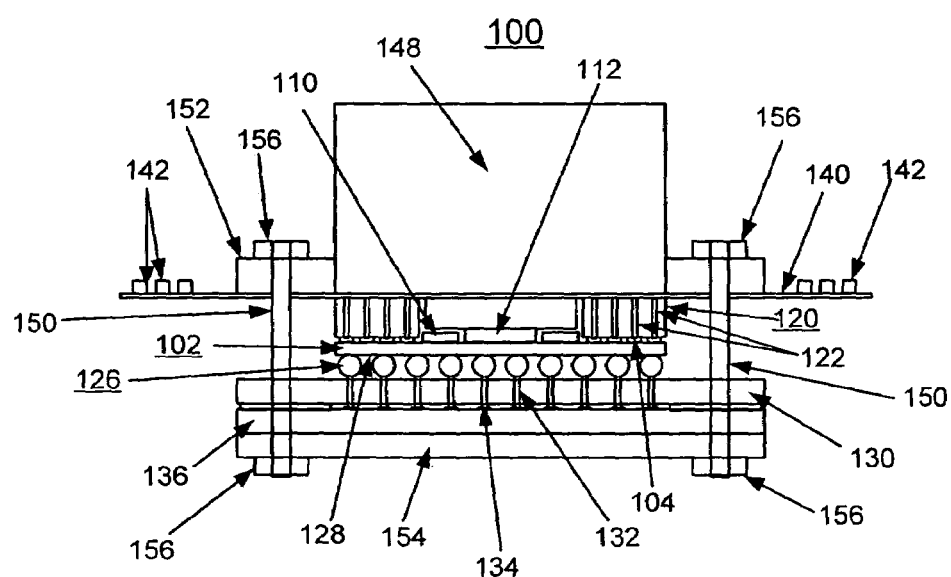
FIG. 2 is a side view illustrating an exemplary embedded probe-enabling socket including an integral probe structure in accordance with the preferred embodiment.

Having reference now to the drawings, in FIGS. 1 and 2, there is shown an exemplary embedded probe-enabling socket including an integral probe structure in accordance with the preferred embodiment generally designated by the reference character 100. Embedded probe-enabling socket 100 is arranged for removable connection using standard socketting techniques to a printed circuit board (PCB).

In accordance with features of the invention, embedded probe-enabling socket 100 includes a separable contact system integrated into the TSM portion of the socket frame. A spring constant of the TSM contacts is defined such that adequate normal force is transferred to the contacts on the BSM of the socket 100, while preventing module substrate warpage as a result of the socket force applied to the die backside. The TSM contacts can be connected to a rigid or flexible PCB or wired through the socket frame.

Embedded probe-enabling socket 100 includes a substrate generally designated by the reference character 102 with a plurality of probe pads 104 arranged in a pattern proximate to an outside perimeter 106 of an upper surface or topside 108 of the substrate 102. A plurality of decoupling capacitors 110 and a generally centrally located die 112 are mounted on the topside 108 of the substrate 102 proximate to the pattern of probe pads 104.

A TSM socket frame generally designated by the reference character 120 includes a plurality of probe pins 122 electrically connecting to respective probe pads 104 on the substrate topside 108. The substrate 102 has internal horizontal wiring layers and vertical connections that are omitted from the drawings for simplicity. The probe pins 122 are electrically connected with a respective signal to be monitored.

The module substrate 102 includes a ball grid array (BGA) generally designated by the reference character 126 on a substrate bottom-side 128 electrically connected to the respective functional signals. A BSM socket frame 130 includes plurality of probe pins 132 electrically connecting to respective functional signal pads 134 carried by a printed circuit card (PCB) 136.

A flex circuit 140, carrying a plurality of high-speed connectors 142 for testing and debug, is electrically connected to the respective probe pads 104 on the substrate topside 108 via the probe pins 122 of the TSM socket frame 120. A heatsink 148 is mounted above the TSM socket frame 120 and flex circuit 140.

A plurality of bolts 150 can extend through aligned holes in the flex circuit 140, and BSM socket frame 130 of the embedded probe-enabling socket 100 and through a pair of opposed backing plates 152, 154, and are secured by nuts 156 to provide required clamping pressure.

Figure 3:
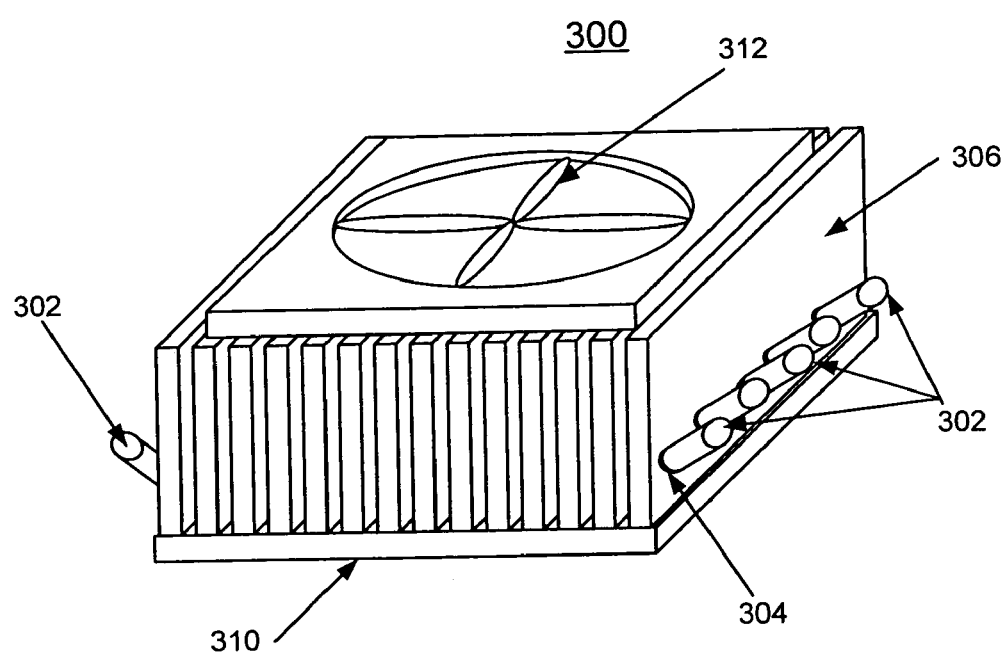
FIG. 3 is a perspective view illustrating an exemplary heatsink and fan assembly with side mounted probes for use with an embedded probe-enabling socket including an integral probe structure of FIGS. 1 and 2 in accordance with the preferred embodiment.

Referring to FIG. 3, there is shown an exemplary embedded probe-enabling socket heatsink and fan assembly generally designated by the reference character 300 in accordance with the preferred embodiment.

Socket, heatsink and fan assembly 300 is a modular design including a plurality of test probes 302 that are inserted into insulated sleeves 304 located in a body 306 of the socket assembly. The probes 302 make contact with pads 104 on the topside 108 of the module substrate 102, as shown in FIGS. 1 and 2. Socket, heatsink and fan assembly 300 includes a heat sink member 310 and a fan 312. The probes 302 are mounted on an angle to contact the topside surface 108 of the substrate 102 outside of area containing a heat spreader and thermal interface material. The probes 302 are arranged to contact the topside surface 108 in a space, for example, which is typically generally unpopulated. The probes 302 are inserted into the insulated sleeves 304 and can be retained with a set screw or other such retention arrangement (not shown). Various types of connectors can be used to interface the probes 302 with subsequent instrumentation.

Figure 4:
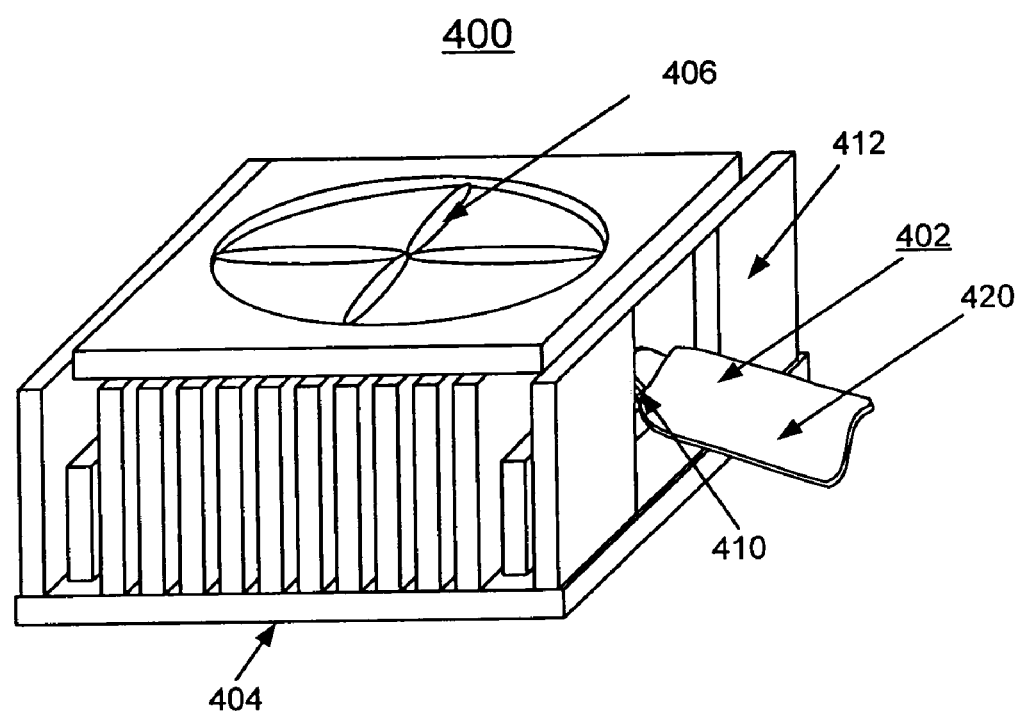
FIG. 4 is a perspective view illustrating another exemplary heatsink and fan assembly with a spring loaded cable assembly for use with an embedded probe-enabling socket including an integral probe structure of FIGS. 1 and 2 in accordance with the preferred embodiment.

Referring to FIG. 4, there is shown another exemplary embedded probe-enabling socket, heatsink and fan assembly generally designated by the reference character 400 with a spring loaded cable assembly 402 in accordance with the preferred embodiment. Socket, heatsink and fan assembly 400 is a modular design including a pad on pad probe connector, such as a high performance array probe connection or probe connector, that is mounted directly into the socket 100.

Socket, heatsink and fan assembly 400 includes a heat sink member 404 and a fan 406. The heat sink member 404 including a relief port 410 defined in a sidewall 412 of the heat sink member. The spring-loaded cable assembly 402 is electrically connected to predefined respective ones of the probe pads 104 on the substrate topside 108, as shown in FIGS. 1 and 2. The spring-loaded cable assembly 402 includes a cable 420 extending through the relief port 410.

While the present invention has been described with reference to the details of the embodiments of the invention shown in the drawing, these details are not intended to limit the scope of the invention as claimed in the appended claims.

What is claimed is:

1. An embedded probe-enabling socket for implementing Top Side of the Module (TSM) signal probing comprising:
    an integral probe structure including
    a substrate including a plurality of probe pads; said plurality of probe pads disposed on a topside of said substrate;
    a TSM socket frame including a plurality of probe pins electrically connecting to respective probe pads on said substrate topside and with a respective signal to be monitored;
    a heat sink member,
    a plurality of insulated sleeves carried by said heat sink member, and
    a plurality of test probes respectively received within said plurality of insulated sleeves; said plurality of test probes being electrically connected to predefined respective ones of said probe pads on said substrate topside;
    said plurality of insulated sleeves carried by said heat sink member extending through a sidewall of said heat sink member at an angle for said test probes to contact said predefined respective ones of said probe pads on said substrate topside, said predefined respective ones of said probe pads on said substrate topside being located proximate to an outside perimeter of said substrate topside.

2. An embedded probe-enabling socket as recited in claim 1 includes a fan carried by said heat sink member.

3. An embedded probe-enabling socket as recited in claim 1 includes a ball grid array (BGA) carried by a bottom-side of said substrate, said BGA electrically coupled to the respective functional signals.

4. An embedded probe-enabling socket as recited in claim 3 includes a Bottom Side of the Module (BSM) socket frame including a plurality of probe pins electrically coupled to said BGA and electrically coupled to a plurality of functional signal pads on a printed circuit board (PCB).

5. An embedded probe-enabling socket as recited in claim 1 includes a flex circuit including at least one connector electrically coupled to respective ones of said probe pads.

6. An embedded probe-enabling socket as recited in claim 1 includes a pair of opposed clamping plates coupled together for providing clamping pressure for said probe pads.

7. An embedded probe-enabling socket for implementing Top Side of the Module (TSM) signal probing comprising:
    an integral probe structure including
    a substrate including a plurality of probe pads; said plurality of probe pads disposed on a topside of said substrate;

a TSM socket frame including a plurality of probe pins electrically connecting to respective probe pads on said substrate topside and with a respective signal to be monitored; and a heat sink member, said heat sink member including a relief port defined in a sidewall of said heat sink member; and a spring-loaded cable assembly extending through the relief port and being electrically connected to predefined respective ones of pins.

8. An embedded probe-enabling socket as recited in claim 7 wherein said spring-loaded cable assembly includes a cable extending through said relief port defined in a sidewall of said heat sink member.

9. An embedded probe-enabling socket as recited in claim 7 includes a fan carried by said heat sink member.

\* \* \* \* \*